(12) United States Patent
Halahmi et al.

(10) Patent No.: US 8,213,239 B2
(45) Date of Patent: Jul. 3, 2012

(54) NON-VOLATILE MEMORY DEVICE

(75) Inventors: Erez Halahmi, Bazra (IL); Gilad Diamant, Haifa (IL); Tamar Ravon, Ramat Aviv (IL); Nery Ben-Azar, Yehud (IL); Jeffrey Levy, Tel Aviv (IL); Ron Naaman, Yarkona (IL)

(73) Assignee: Novatrans Group SA, Vaumarcus NE (CH)

( * ) Notice: Subject to any disclaimer, the term of this patent is extended or adjusted under 35 U.S.C. 154(b) by 857 days.

(21) Appl. No.: 12/064,165

(22) PCT Filed: Aug. 17, 2006

(86) PCT No.: PCT/IL2006/000963
§ 371 (c)(1),
(2), (4) Date: Oct. 30, 2008

(87) PCT Pub. No.: WO2007/020648
PCT Pub. Date: Feb. 22, 2007

(65) Prior Publication Data
US 2011/0128784 A1    Jun. 2, 2011

Related U.S. Application Data

(60) Provisional application No. 60/708,778, filed on Aug. 17, 2005, provisional application No. 60/713,744, filed on Sep. 6, 2005, provisional application No. 60/731,234, filed on Oct. 31, 2005, provisional application No. 60/731,235, filed on Oct. 31, 2005, provisional application No. 60/731,251, filed on Oct. 31, 2005.

(51) Int. Cl.
*G11C 16/04* (2006.01)

(52) U.S. Cl. .......... 365/185.29; 365/185.03; 365/189.09
(58) Field of Classification Search .............. 365/185.03, 365/189.29, 185.29
See application file for complete search history.

(56) References Cited

U.S. PATENT DOCUMENTS

| | | | |
|---|---|---|---|
| 6,118,695 A * | 9/2000 | Yoneyama | 365/185.09 |
| 6,344,674 B2 * | 2/2002 | Lu | 257/316 |
| 6,477,087 B2 * | 11/2002 | Tanaka et al. | 365/185.22 |
| 6,489,650 B2 | 12/2002 | Kumazaki | |
| 6,693,009 B1 * | 2/2004 | Kim et al. | 438/257 |
| 2001/0017344 A1 | 8/2001 | Aebi | |
| 2002/0130353 A1 | 9/2002 | Lieber et al. | |
| 2002/0163031 A1 | 11/2002 | Liu et al. | |
| 2009/0108351 A1 * | 4/2009 | Yang et al. | 257/347 |

OTHER PUBLICATIONS

A. Samokhvalov et al., "Assemblies of CdS Quantum Particles Studied by the Attenuated Low Energy Photoelectron Spectroscopy", Journal of Physical Chemistry, vol. 104, No. 36, pp. 8631-8634, Sep. 14, 2000.

(Continued)

*Primary Examiner* — Pho M Luu
(74) *Attorney, Agent, or Firm* — Browdy and Neimark, PLLC

(57) ABSTRACT

An electronic memory device includes at least one basic unit, which is configured as a memory cell for storing at least one bit of information. The basic unit includes a vacuum cavity for free charge carriers propagation therethrough, a region of charge carriers emission or entry into the vacuum cavity, an anode electrode which are kept under controllable voltage conditions, and at least one floating gate electrode accommodated in a path of the free charge carriers propagating through the vacuum cavity between the emission or entry region and the anode. The floating gate electrode serves for storing therein a charge indicative of the at least one bit of information.

50 Claims, 13 Drawing Sheets

OTHER PUBLICATIONS

Y. Paltiel et al., "Self-assembling of InAs nanocrystals on GaAs: The effect of electronic coupling and embedded gold nanoparticles on the photoluminescence", Applied Physics Letters, vol. 89, pp. 033108-1-033108-3, 2006.

C. Nogues et al., "Electrical properties of short DNA oligomers characterized by conducting atomic force microscopy", Phy. Chem. Chem. Phys., vol. 6, pp. 4459-4466, 2004.

International Search Report mailed Oct. 4, 2007.

* cited by examiner

NON-VOLATILE MEMORY DEVICE

FIELD OF THE INVENTION

The present invention is in the field of electronic memory and relates to a non-volatile memory device.

BACKGROUND OF THE INVENTION

Memory is generally of two main categories: volatile and nonvolatile. Volatile memory loses any data as soon as the system is turned off; it requires constant power to remain viable. Most types of random access memory (RAM) fall into this category.

Non-volatile memory (NVM) is a general term for memory that retains its content when a power supply thereto is stopped. A conventional NVM device is a MOS transistor that has a source, a drain, an access or a control gate, and a floating gate. It is structurally different from a standard MOSFET in its gate, which is electrically isolated, or "floating". Generally, there are two main types of NVM devices: floating gate based and charge-trapping based memory devices.

Floating gate based devices are typically MOS transistors that have a floating gate, in which charge is stored, and which is buried within the gate oxide, and has inter-polysilicon dielectric (IPD) beneath a control gate. More specifically, as shown in FIG. 1A, floating gate memories consist of a stacked gate MOS transistor, where the first gate is the floating gate that is buried within the gate oxide and the inter-polysilicon dielectric (IPD) beneath the control gate with IPD (which may be oxide or oxide-nitride-oxide isolating the floating gate), and the second gate is the control gate which is the external gate of the memory transistor. Floating gate devices are typically used in EPROM (Electrically Programmable Read Only Memory) and EEPROM's (Electrically Erasable and Programmable Read Only Memory).

Charge trapping devices store charge in discrete nitride traps, and are typically used in MNOS (Metal Nitride Oxide Silicon), SNOS (Silicon Nitride Oxide Semiconductor), and SONOS (Silicon Oxide Nitride Oxide Semiconductor) devices. FIG. 1B shows a typical MNOS charge-trapping memory structure.

In both the floating gate and the charge-trapping memory devices, the stored charge (which is indicative of the stored data) is retained when the power supply is removed. Causing a charge to be stored in a memory device is known as programming the device. The charge needed to program the device has to be injected into the floating gate or into the nitride layer. For this purpose, two main mechanisms have been shown to be viable: Fowler-Nordheim (FN) tunneling, and channel hot-electron injection (CHE). Causing the stored charge to be removed from the floating gate or nitride layer is known as erasing the device. There are two methods of erasing or discharging: FN tunneling and emission by ultraviolet (UV) radiation.

SUMMARY OF THE INVENTION

The present invention provides a novel non-volatile memory device. The device of the present invention utilizes an electrode configuration including a floating electrode, in which the charge is stored, while utilizing free charge carrier propagation in vacuum.

Thus, according to one broad aspect of the present invention, there is provided an electronic memory device comprising at least one basic unit, which is configured as a memory cell for storing at least one bit of information, the basic unit comprising a vacuum cavity for free charge carriers propagation therethrough, and comprising a region of charge carriers emission or entry into the vacuum cavity and an anode electrode which are kept under controllable voltage conditions, and at least one floating gate electrode accommodated in a path of said free charge carriers propagating through the vacuum cavity between said emission or entry region and said anode, said at least one floating gate electrode serving for storing therein a charge indicative of the at least one bit of information.

The voltage conditions determine an electric field created in the vacuum cavity, thereby defining whether or not, and how many, charge carriers reach the anode, resulting in the electric output at the anode.

The basic unit(s) is/are associated with a control system. The latter includes a controllably operated voltage supply unit to controllably vary the voltage conditions. The control system is configured and operable to selectively cause programming of the at least one memory cell, reading the information stored in the memory cell and erasing the stored information.

Also, the control unit may be configured and operable to be responsive to data indicative of an electrical output from the anode electrode. The anode may be electrically connected to another electronic device (e.g. memory device) such that the electrical output of the anode serves as an input to this electronic device.

The source of charge carriers defining the emission region may include at least one cathode associated with an exciter for emitting electrons by at least one of the following effects: thermo-emission, photo-emission, and field-emission. The electric field is thus determined by potential differences between the cathode, the floating gate, and the anode. Considering the use of a photocathode as the source of the charge carriers, it is associated with (exposed to, directly or not) an illuminator controllably operated to cause electrons emission from the photocathode.

If no internal cathode is used, the vacuum cavity is formed with a window defining the entry region for injecting the free charge carriers therethrough into the cavity from an external emitter. The electric field is thus determined by the charge on the floating gate and the voltage on the anode.

In one embodiment, the floating gate electrode is of a ring-like shape defining an aperture in the electrons path towards a central part of the anode. In another embodiment, the floating gate electrode is a plate aligned with a central part of the anode. Yet another option is to use the floating gate electrode in the form of a grid accommodated adjacent, e.g. to the anode or to the emission/entry region.

The memory cell may be configured for storing a single bit of information. The charged and discharged states of the floating gate correspond to Boolean values '1' and '0'. Alternatively, the memory cell may be configured for storing multiple bits of information corresponding to distinct ranges of the electrical output at the anode.

The device may be configured to enable erasing of the previously stored information by tunneling of the charge carriers from the floating gate electrode. This may be implemented by using an additional electrode located close to and electrically insulated from the floating gate electrode, such that an effect of charge carriers tunneling from the floating gate electrode to the additional electrode is substantially small under programming and reading of the memory cell and is substantially higher when a relatively large voltage is applied to the additional electrode. Another example of such tunneling based erasing is to utilize tunneling of the charge carriers from the floating gate electrode to the anode or to the cathode.

Another possibility is to connect the floating gate to a switch unit, which discharges the floating gate when it is "closed". Such a switch may be implemented using, for example, an illuminated photocathode and an anode, where the potential difference between the photocathode and the anode determines whether or not electrons manage to escape. Electrically connecting the floating gate to the photocathode allows the former to be discharged when the latter emits electrons. Whether or not electrons are emitted is controlled via the voltages applied to the photocathode and its corresponding anode. It is also possible to discharge the floating gate utilizing at least one of photo-emission, field-emission, and thermo-emission effects. It is possible, furthermore, for both the cathode and the floating gate to be photoemissive, in which case the floating gate should effectively have the higher work function so that it is not discharged inadvertently if/when exposed to the illumination required for the photocathode to emit electrons.

The device may include a matrix of the memory cells arranged in a manner allowing for addressing individual memory cells, or groups of cells, for programming, reading and erasing operations.

The matrix may be configured so that the anodes of all the memory cells are arranged in a spaced-apart relationship along a first axis and connected to a first common line, and the cathodes of all the memory cells are arranged in a spaced-apart relationship along a second axis and connected to a second common line. The selective addressing of a single memory cell is achieved by providing the predetermined voltage conditions in the vacuum cavity of the respective memory cell, different from the voltage conditions in the other memory cells.

The floating gate electrode of each memory cell may be aligned with a central part of the respective anode. Shielding electrodes may be used being located around each of the memory cells, thereby reducing electrostatic cross talk between the memory cells. The shielding electrodes may be kept at ground potential, or may be electrically connected to the cathode.

The matrix of the memory cells may be formed by cathode strips arranged in the spaced-apart relationship along the first axis in a first plane, anode strips arranged in the second spaced-apart parallel plane, the floating gate electrodes aligned with overlapping regions between the cathodes and the anodes, and shielding electrodes formed by a patterned shielding electrode layer located between the first and second planes.

The matrix of the memory cells may be formed by a single cathode (e.g. photocathode) electrode defining the emission region shared by a two-dimensional array of the memory cells.

According to one specific example, the two dimensional array of the memory cells associated with the single cathode includes the anode strips arranged in a spaced-apart relationship in a plane spaced-apart and parallel to the cathode plane, first array of shielding electrodes accommodated in a space between the cathode and the anodes' planes and extending parallel to the anodes strips, second array of shielding electrodes located over said first shielding electrodes orthogonal thereto, the floating gates that are located in a plane above the anodes' plane close thereto and are aligned with regions defined by intersections of the first and second shielding electrodes, and gate electrode strip pairs accommodated such that shielding between them is provided by the second shielding strips, said gate electrode strips serving to select and deselect the anodes' line.

According to another example, the two dimensional array of the memory cells associated with the single cathode includes the anode strips arranged in a spaced-apart relationship in a plane spaced-apart and parallel to the cathode plane, an array of control gate electrodes accommodated in a space between the cathode and the anodes' planes and extending orthogonal to the anodes strips, and the floating gates that are located in a plane above the anodes' plane close thereto and are aligned with regions defined by intersections of the anode and control gate electrodes. The floating gates are of the smallest feature size F, thereby defining a minimal area of intersection between the anode strips and the control gates, upon which the floating gates are located. Accordingly, the size of each individual memory cell in the matrix is $2F \times 2F = 4F^2$.

According to yet another example, two dimensional array of the memory cells associated with the single cathode includes the anode strips arranged in a spaced-apart relationship in a plane spaced-apart and parallel to the cathode plane, an array of control gate electrodes accommodated in a space between the cathode and the anodes' planes and extending orthogonal to the anodes strips, the floating gates, and an electrically conductive perforated plate placed over the anode and control gate strips being between these strips and the cathode plane. The plate is perforated at the intersections of the anode and control gate strips, with edges of each perforation being coated with an electrically insulating material. The floating gates are formed by an electrically conductive layer deposited on the electrically insulating coating, such that each of the floating gates covers the edges of a region of intersection of the corresponding anode and control gate. The electrically conductive plate is placed at an offset to the intersections thereby allowing the charge carriers that reach the perforation from the cathode to undergo at least one of the following: reach the respective anode and be affected by a potential of the respective anode, and also to be affected by a potential of the respective control gate. Here, a size of an individual cell in the matrix is $2F \times 2F = 4F^2$, where F is the minimal feature size.

Preferably, the floating gate is a self-assembled structure formed by a monolayer to which electrically conductive nanoparticles are attached. This monolayer is formed by organic molecules self-assembled on a substrate. If the substrate is the anode of the memory cell, programming of the memory cell is performed by biasing the anode at a positive potential and charging the floating gate by free electrons. Preferably, an electrons director assembly is provided being associated with the emission region of a photocathode and configured for directing the emitted electrons to a particular area of the monolayer. Such electrons director assembly may include plates or a grid screen.

As indicated above, the memory cell may be configured for storing the multiple bits of information corresponding to distinct ranges of the electrical output at the anode. This can be implemented by providing a gate electrode, an array of the floating gate electrodes of a number corresponding to the number of information bits storable in the memory cell, and a corresponding array of additional anode electrodes interlaced with the floating gates. Each additional anode has an output contact in which an electric current is induced by arrival of the charge carriers to the respective anode. The gate electrode shields the floating gate closest to the charge carriers' emission/entry region from direct bombardment by the charge carriers and can be used for selection of a particular multi-bit cell.

The memory device may be formed by a plurality of such multi-bit memory cells. Such a device may include a structure formed by the main anode common to all the cells, an array of anode strips extending in one planar direction and stacked one above the other, an array of interconnected control gates accommodated over the anode strips and oriented orthogonal thereto, an array of the floating gates located in between the stacked anodes in regions defined by intersections of the anode stacks and the control gates. The anode stacks and the floating gates are perforated within the intersections between them revealing the main anode. A common photocathode defines the emission region located over the above structure.

An array of additional electrode strips may be provided being arranged such that each additional electrode is common to two adjacent memory cells. The two memory cells thereby form a block unit mirrored about the common additional electrode. The additional electrodes extend parallel to the anodes and are therefore common also to all the memory cells arranged along the axis of the additional electrode strips.

In another broad aspect, the invention provides for manufacturing a floating gate using a self assembled monolayer to which metal nanoparticles are attached, and a memory cell utilizing such floating gate.

It is important to note that the present invention also provides a novel non-volatile memory device that holds a comparatively large number of bits per cell.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF EXEMPLARY EMBODIMENTS

Figure 1A:
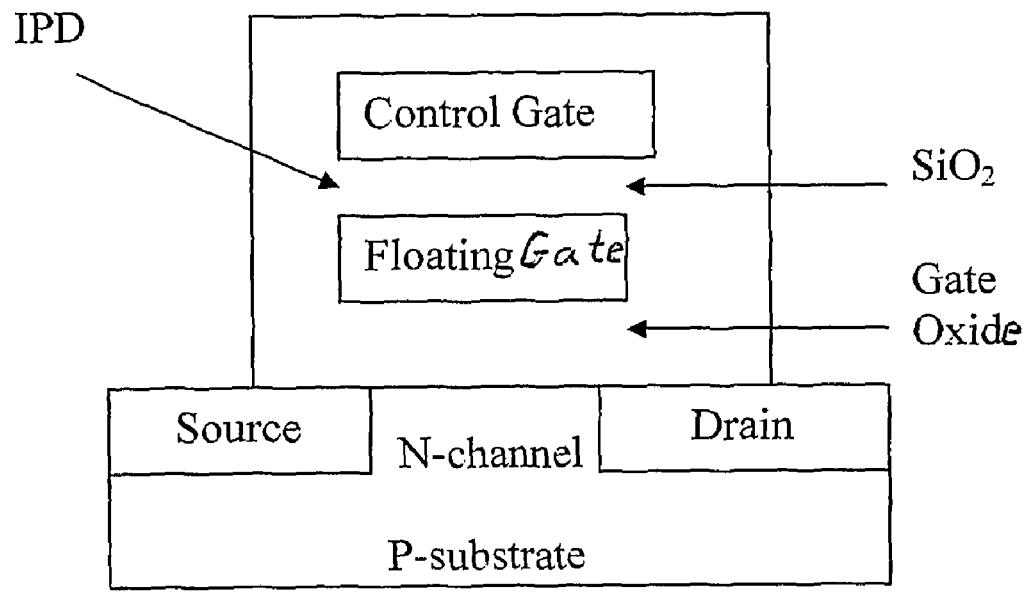
FIGS. 1A and 1B show conventional configuration of, respectively, a MOS transistor based floating gate memory device, and MNOS charge-trapping memory device.
Figure 1B:
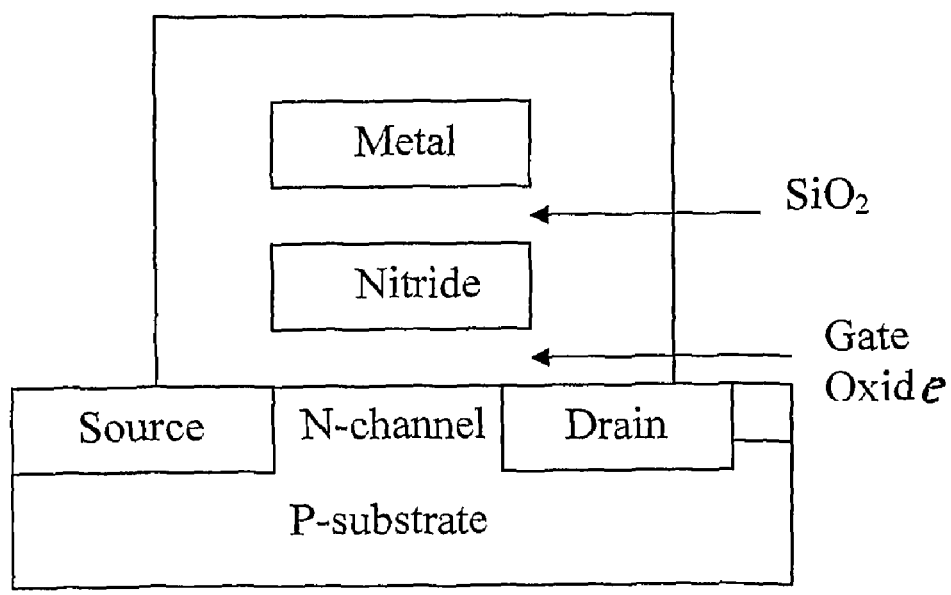

The generic configurations of conventional MOS transistor based non-volatile memory devices are shown in FIGS. 1A and 1B.

Figure 2:
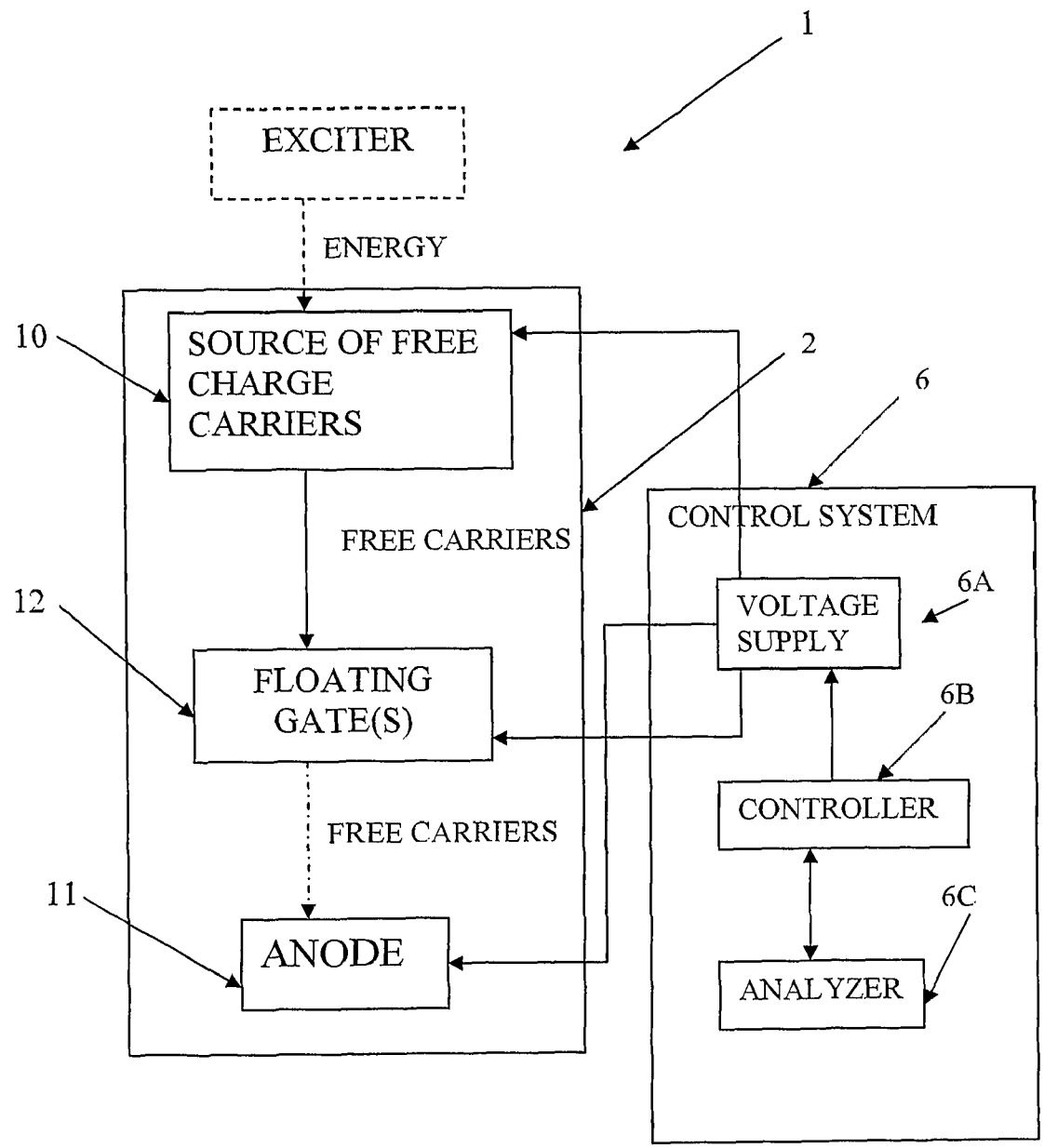
FIG. 2 schematically illustrates a basic device unit, or memory cell, of the present invention configured for storing at least one bit of information.

Referring to FIG. 2, there is shown schematically a basic unit or memory cell 1 of the present invention configured for storing at least one bit of information (i.e. '0' or '1'). Memory cell 1 is configured to define a vacuum cavity 2 for free propagation of charge carriers (e.g. electrons) therethrough, and includes a source of such charge carriers 10, a target electrode (anode) 11 for attracting the charge carriers to propagate towards it, and a floating electrode 12 for storing charge indicative of stored data. Memory cell 1 is associated with a control system 6 that includes inter alia a voltage supply unit 6A operated by a controller utility 6B to controllably vary the voltage supply to the electrodes, and a receiver and analyzer 6C of electrical output from anode 11.

It should be noted that there is no constraint on source 10 of free charge carriers for the device of the present invention. This may be a cathode associated with an appropriate actuator or exciter for emitting electrons by thermo-, photo-, or field-emission, or may be constituted by a suitable aperture (window) for injecting electrons therethrough into the cavity from an external electron emitter.

An electric field created in device cavity 2 determines whether or not, and how many, electrons reach anode 11, thereby generating an observable (readable) electric current. Data indicative of the read electric current is input to the control unit or to another electronic device. The electric field is determined by potential differences between cathode 10, floating gate 12, and anode 11.

Figure 3A:
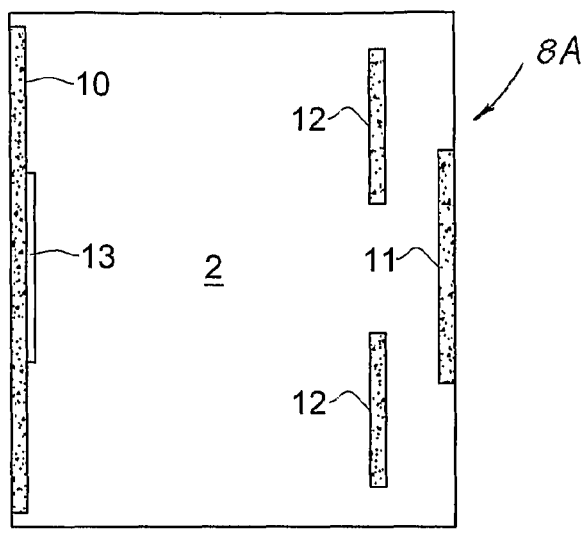
FIGS. 3A and 3B show two examples of the memory cell configuration of the present invention.
Figure 3B:
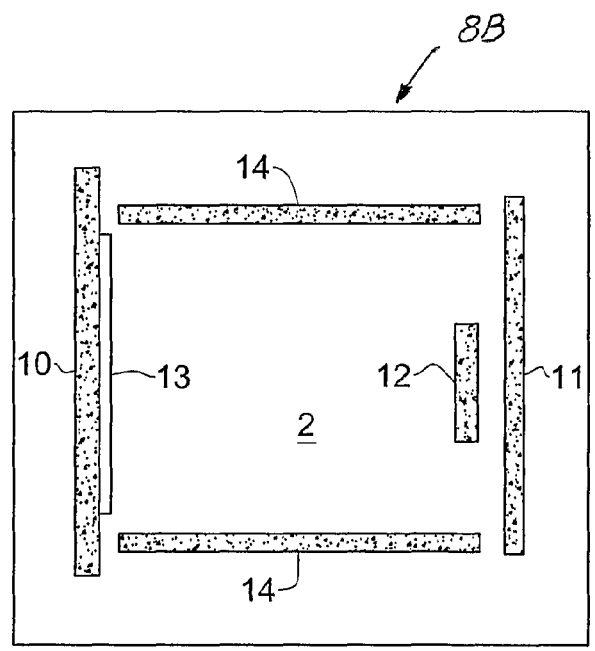

Reference is made to FIGS. 3A and 3B showing two specific but not limiting examples of the memory cell of the present invention. To facilitate understanding, the same reference numerals are used for identifying components that are common for all the examples of the invention. These figures present side-sectional view of cylindrically symmetrical devices 8A and 8B, respectively, each including a cathode 10 (constituting a source of free electrons), an anode 11, and a floating gate 12 arranged so as to define a vacuum cavity for electrons propagation from the cathode towards the floating gate. In the example of FIG. 3A, floating gate electrode 12 has a ring-like shape defining an annular aperture in the electrons path towards the central part of the anode, while in the example of FIG. 3B floating gate electrode 12 is positioned over the central part of anode 11. It should be noted that the cylindrically symmetrical configuration of the device is optional, and the shapes and spatial configuration of the electrodes may differ; e.g., using a floating grid adjacent to the anode or to the cathode, in order to obtain a stronger field in that region.

In these examples, electrons (constituting charge carriers) are emitted from cathode region 13. As indicated above, in case no cathode is used, this region 13 would constitute an aperture through which electrons enter the vacuum cavity from an external electron emitter. Thus, generally, region 13 is an electron emission/entry region of the memory device. In case there is no cathode in the device and electrons are injected through region 13 from an external electron emitter, the kinetic energy of the incoming electrons (particularly the normal energy) corresponds to an equivalent cathode potential (were it present) and can be adjusted using suitable electromagnetic fields.

As indicated above, an electric field created in device cavity 2 determines whether or not, and how many, electrons reach anode 11, thereby generating an observable (readable) electric current. The electric field is determined by the potential differences between cathode 10, floating gate 12, and anode 11.

Writing to, or programming the device consists of charging its floating gate 12. Voltages are applied to cathode 10 and anode 11 to provide a programming potential difference $V_{prog}$ that causes charge carriers (electrons) to reach also the floating gate 12 and accumulate therein. This results in charging the floating gate until it reaches a certain potential that no longer allows electrons to reach floating gate 12. Floating gate 12 then retains this charge. In order to read the device, voltages are applied to cathode 10 and anode 11 to create a different, reading potential difference $V_{read}$ resulting in an anode current $I_a$, which is affected by the pre-programmed floating gate charge. Erasing the device consists of discharging the floating gate. The floating gate can be caused to emit the accumulated charge by means of field emission (by applying suitable voltages to the cathode and anode), photoemission (by exposing the floating gate to light of suitable wavelength), thermoemission, or any combination of these methods. The floating gate may also be connected to a "switch" device that allows discharging of the floating gate when the switch is closed.

In case the device stores a single-bit, the Boolean value '1' may correspond to the device being 'on', i.e., significant anode current during a read operation, and the Boolean value '0' to the device being 'off'. In the latter case, during programming, the floating gate is negatively charged to such a potential that, effectively, no electrons reach the anode ($I_a=0$) under read operation conditions (i.e., reading potential difference $V_{read}$ between the cathode and anode). Thus, charging the floating gate sets the device to 'off', or '0'. A non-charged gate allows electrons to reach the anode, setting the device to 'on', or '1'.

Alternatively, multiple bit states can correspond to distinct ranges of the anode current. For example, the two-bit state '00' may correspond to very little or no anode current, the state '11' may correspond to the maximal anode current, and the values '01' and '10' may correspond to two intermediate values of the anode current. In this case, a corresponding number of $V_{prog}$ potential differences are required, each of which causes a distinct amount of charge to accumulate on the floating gate. The distinct amounts of charge correspond to different anode currents when $V_{read}$ is applied. For example, linearity of the dependence of the anode current on the gate's potential, may improve the ability to distinguish between different states.

For example, let us consider device 8A of FIG. 3A, where cathode 10 is a photocathode associated with an illuminator (not shown) controllably operated to cause electrons emission from the cathode, the cathode-anode potential difference is $V_{C-A}$ volts, and the floating gate 12 is initially uncharged. Under these conditions, electrons emitted from cathode 10 reach both the anode 11 and the gate 12. Electrons reaching floating gate 12 cause it to become negatively charged. Electrons continue to reach the floating gate 12 until its potential relative to that of cathode 10 becomes roughly equivalent to (−K), where K is the maximal kinetic energy of the emitted electrons. The total charge accumulated on floating gate 12 depends on the cathode-anode potential difference $V_{C-A}$, the maximal kinetic energy of the emitted electrons K, and the inter-electrode capacitances as well as the self-capacitance of the floating gate. This charge is retained in the floating gate.

Let us now consider the device of FIG. 3A, where the (photo-) cathode 10 is suitably illuminated to emit electrons and the cathode-anode potential difference is $V'_{C-A}$ volts. Then, if floating gate 12 has previously been sufficiently charged, electrons will not be able to reach anode 11 and a '0' state of the device will be the result. If floating gate 12 has not been charged, electrons will be reaching anode 11 and will be producing an anode current, resulting in a '1' being read. In the latter case, electrons will be reaching floating gate 12 until the latter reaches a potential of (−K) relative to that of cathode 10. The charge thus accumulated (which depends on $V'_{C-A}$, K, and the capacitances) is insufficient to prevent electrons from reaching the anode. It is also possible to employ a programming operation for '1' as well as '0' states of the device. In this case, during the '1' programming operation, the cathode-anode potential is set to the value that will result in a charge on the floating gate not allowing electrons to reach the floating gate when the cathode-anode potential is $V'_{C-A}$.

Figure 4A:
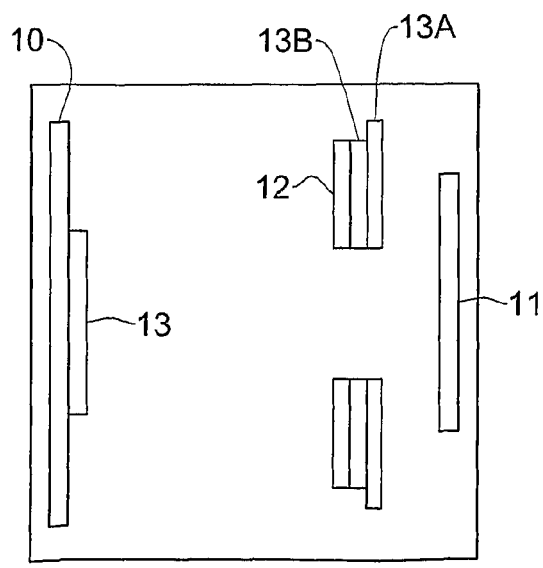
FIGS. 4A and 4B exemplify the memory cell configuration facilitating erasing, or discharging, a previously programmed device FIG. 5 exemplifies a memory device formed by a matrix of memory cells such as of FIG. 3B.

A number of methods can be used to erase, or discharge, a previously programmed device. This is exemplified in FIGS. 4A and 4B. As shown in the example, of FIG. 4A, an additional electrode 13A is placed next to the floating gate electrode, separated from it by a suitable thin electric isolator 13B, such that an effect of electron tunneling from floating gate 12 to additional electrode 13A is slight under read and write (i.e., programming) operating conditions but is significant when a relatively large voltage is applied to electrode 13A. Alternatively, electrons from the floating gate may tunnel to the anode or cathode during an erase operation. In this case a large enough cathode-anode potential is provided during an erase operation to induce tunneling (and the electrodes' shapes and configuration are selected to ensure that tunneling occurs from the floating gate (e.g., to the anode), but not to the floating gate (e.g., from the cathode).

Figure 4B:
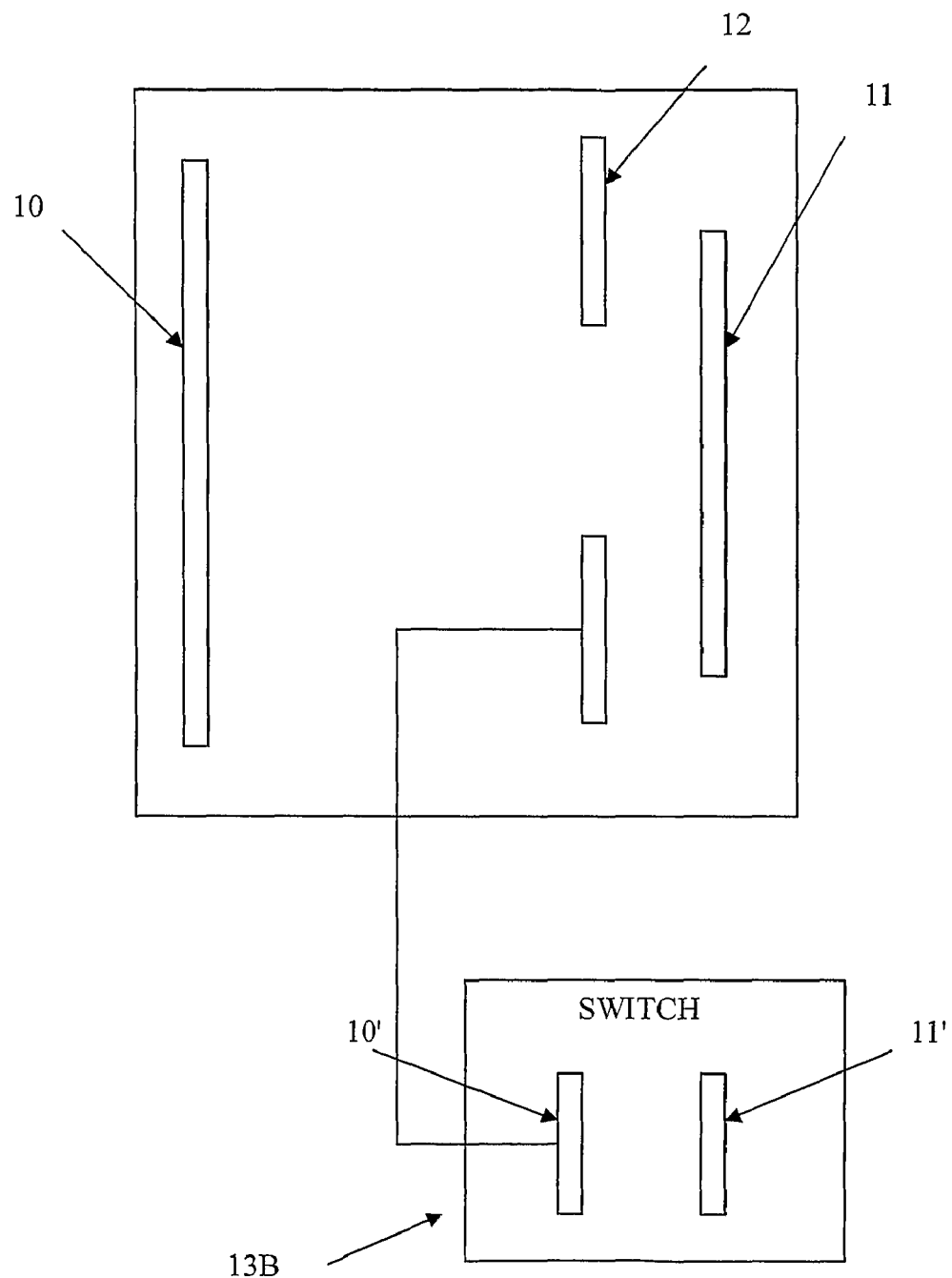

As exemplified in FIG. 4B, another possibility is to connect floating gate 12 to a switch 13B that closes during an erase operation, thereby grounding or otherwise discharging the floating gate. The term "switch" used herein refers to any device that controllably modifies (e.g., allows or prevents) the flow of electric current. An example for such a switch is an additional cathode-anode pair, with this additional cathode 10' being connected to floating gate 12 of the memory cell, where under read and write operating conditions no emission can occur from cathode 10' to its associated anode 11', but where emission does occur under erase operation conditions. Such additional cathode 10' may be an illuminated photocathode, which is always at the potential of floating gate 12. Anode electrode 11' is therefore to be held during read and write operations at a potential that does not allow electrons to leave cathode 10' (whose potential is determined by the floating gate 12 potential). During an erase operation, the potential of anode 11' is to be suitably modified to allow electrons to escape cathode 10' and discharge floating gate 12.

Yet another possibility of erasing or discharging a programmed device is to use such techniques as photoemission, field emission, or thermo-emission, or any combination of these methods, by exposing the floating gate to a suitable external field. These methods of emission are applicable also to the cathode as a source of electrons, and can be combined with the floating gate discharge function. For example, both the cathode and the floating gate electrodes may be made of photoemissive material(s) e.g. with distinct effective work functions. In case the photocathode has a lower work function than that of the floating gate electrode, both electrodes can be exposed to the same illumination (either continuously or during operations) with light that is energetic enough for electrons to be emitted from the photocathode, but not energetic enough for electrons to be released from the floating gate. The electron source is thus made active without discharging the floating gate. Then, in order to discharge the floating gate during an erase operation, the floating gate can either be exposed to light that is more energetic, or suitable potentials can be applied to the cathode and the anode to cause field assisted photoemission, i.e. to help the electrons in the floating gate, that are already excited due to the illumination (photovoltaic emission), to escape.

In the above-described single-cell device of the present invention, erasing a device consists of discharging the floating gate. However, if the basic unit device (memory cell) is one of a plurality of similar devices, then it is possible instead to perform write operations on the rest of the devices and adjust the potentials applied in subsequent read and write operations. It is then possible to discharge the floating gates of the devices at some other convenient time.

The true functionality of a memory device is in a collection of such basic units, capable of storing large scale data. Conventionally, MOS transistor memory devices are arranged in a matrix form, where the devices in each column share a line connecting to their drains and the devices in each row share a line connecting to their control gates. An individual device is selected for reading or writing by applying appropriate voltages to both its column line (known as a bit-line) and its row line (called a word-line); i.e., appropriate voltages are applied to both its drain and control gate. Other devices in the same column or row are deselected for operation by having the appropriate voltage applied either to their drains or control gates, respectively, but not to both. Erase operations can be performed individually, or on blocks of devices, as in flash memory.

A plurality of devices (basic units or memory cells) according to the present invention can similarly be organized in a matrix form that allows individual and/or block access. For the purpose of illustration, anodes of all the devices in a column can be connected to a common line, and cathodes of all the devices in a row can be connected to another common line.

It should be understood that the terms "rows", "columns", and "matrix" regarding a collection of memory cells are logical terms and in no way limit the geometry of such a collection.

Because potentials applied to the cathode and anode of each device determine the device operation, a certain device can be selectively addressed by applying suitable voltage to both its column and row lines, whereas other devices in the same column or row are deselected by having non-suitable voltage applied to their rows or columns, respectively.

For example, in a write operation on a single device, a potential difference is applied between the cathode and the anode that allows electrons emitted from the cathode to reach the anode. If the device is part of a matrix of such devices, then it is possible to deactivate other devices along the same row line (i.e. sharing the same cathode potential) by applying to their column lines (anodes) a potential that is sufficiently lower than that of their cathodes. It is similarly possible to deactivate other devices along the same column (i.e. sharing the same anode potential) by placing their row lines (cathodes) at a sufficiently higher potential than that of their anodes. In general, a device can be de-selected by placing its anode at a sufficiently lower potential than that of the cathode, thus preventing electrons from reaching the floating gate. In some configurations it is also possible to prevent charging by placing the device anode (column) at a sufficiently high potential relative to the cathode so that electrons are strongly attracted to the anode and do not reach the floating gate (e.g. pass by it) or are not retained on the floating gate.

In a read operation on a single device, another potential difference is applied between the cathode and the anode. Electrons reach the anode unless the floating gate is sufficiently charged, and therefore the output at the anode corresponds to the stored data. In order to deselect other devices for reading, it is again possible to apply voltages to their rows and/or columns so that their anode potentials are sufficiently lower than their cathode potentials to prevent electrons from reaching the anode regardless of the floating gate charge.

In an erase operation on a matrix of memory cell devices according to the present invention that uses, for example, tunneling from the floating gate to the anode as a discharge method, an entire column can be discharged at once by placing the column line at a suitably high voltage relative to the relevant row lines, or cathodes. It is also possible to de-select devices along the column line by placing their row lines (cathodes) at a potential sufficiently high to prevent tunneling. Then, however, it may be necessary to place the other column lines at a similar potential. The exact potentials which cause or prevent tunneling depend on the electrodes' shapes and configuration, on the inter-electrode distances, materials used, etc.

Erasing a plurality of cells, such as a column or a block, usually precedes programming the cells with new data. A novel and useful property of a device according to the present invention, particularly one that utilizes tunneling as a discharge method, is that a cell can be reprogrammed directly, without "erasing" it first. In other words, the program and discharge methods can be combined in a single "rewrite", or generalized programming operation, that sets the floating gate to any desired potential regardless of its prior state. The write and erase operations described so far are in fact specific cases of this general programming method. This is done by enabling newly emitted electrons to reach the floating gate at the same time as it is being discharged, where the final retained charge is determined by the cathode-anode potential.

For example, a device can be re-programmed by setting its cathode-anode potential to one that induces tunneling while electrons are emitted by the cathode. This leads to two competing processes: charging of the floating gate by emitted electrons, and discharging of the floating gate by tunneling.

As the floating gate becomes more negatively (or less positively) charged, fewer electrons reach it; therefore, the charging slows down and the floating gate becomes more positive due to the discharging. Similarly, as the floating gate becomes more positively (or less negatively) charged, more electrons reach it and cause it to become more negatively charged. In general, these two processes continue until equilibrium is reached whereby the floating gate is at its new potential, determined by the cathode-anode potential, the kinetic energy of the electrons, the capacitances, etc. Because tunneling is a relatively slow process, the charging process can overtake the discharging process. In a multi-cell operation, where a plurality of cells is reprogrammed in parallel, the required time of operation is determined by the time required to discharge the cell with the largest (positive) difference between final and initial potentials. This can still be a considerably shorter time than that required to discharge all the cells back to zero potential and program them anew.

A crucial factor in the functionality of a memory cells' array is the ability of the cells to retain their states (programmed or not; '0' or '1') once the power supply to the device has been cut off. The use of tunneling as a discharge method, e.g., by placing the floating gate very close to all or part of the anode, may lead to a design that results in leakage currents (i.e., undesirable tunneling of electrons from the gate to the anode when power to the memory array has been cut off). A possible method of countering, or at least significantly decreasing, this effect includes the following: Prior to the power being cut off but after emission from the cathodes has been stopped, every anode in the array is set to some potential that reduces the maximal potential difference between the column's anode and each of its floating gates, thus reducing the probability of undesirable tunneling.

In general, dielectric (e.g. oxide) coating of the floating gate can help retention of charge (i.e., prevent leakage).

Turning back to FIG. 3B, in which floating gate electrode 12 is positioned over the central part of anode 11, rather than in a ring shape (as in FIG. 3A), electrons either hit the floating gate directly during a write (program) operation or bypass it and hit anode 11 at the surrounding areas during a read operation. Such a configuration may be beneficial for the production of a highly dense array of cells, as the number of features per cell is much smaller. An additional improvement would be by placing of shielding electrodes 14 around each memory cell, in order to eliminate any electrostatic cross talk between the cells. The shielding electrodes may for example be circular or rectangular in shape. These shielding electrodes may be kept at ground potential. Otherwise they can be electrically connected to cathode 10—this will not alter in any significant way the functionality of the device, but rather assist in focusing electrons to the centered floating gate in a write mode, thus enabling a much faster charging time and/or much lower charging currents.

Figure 5:
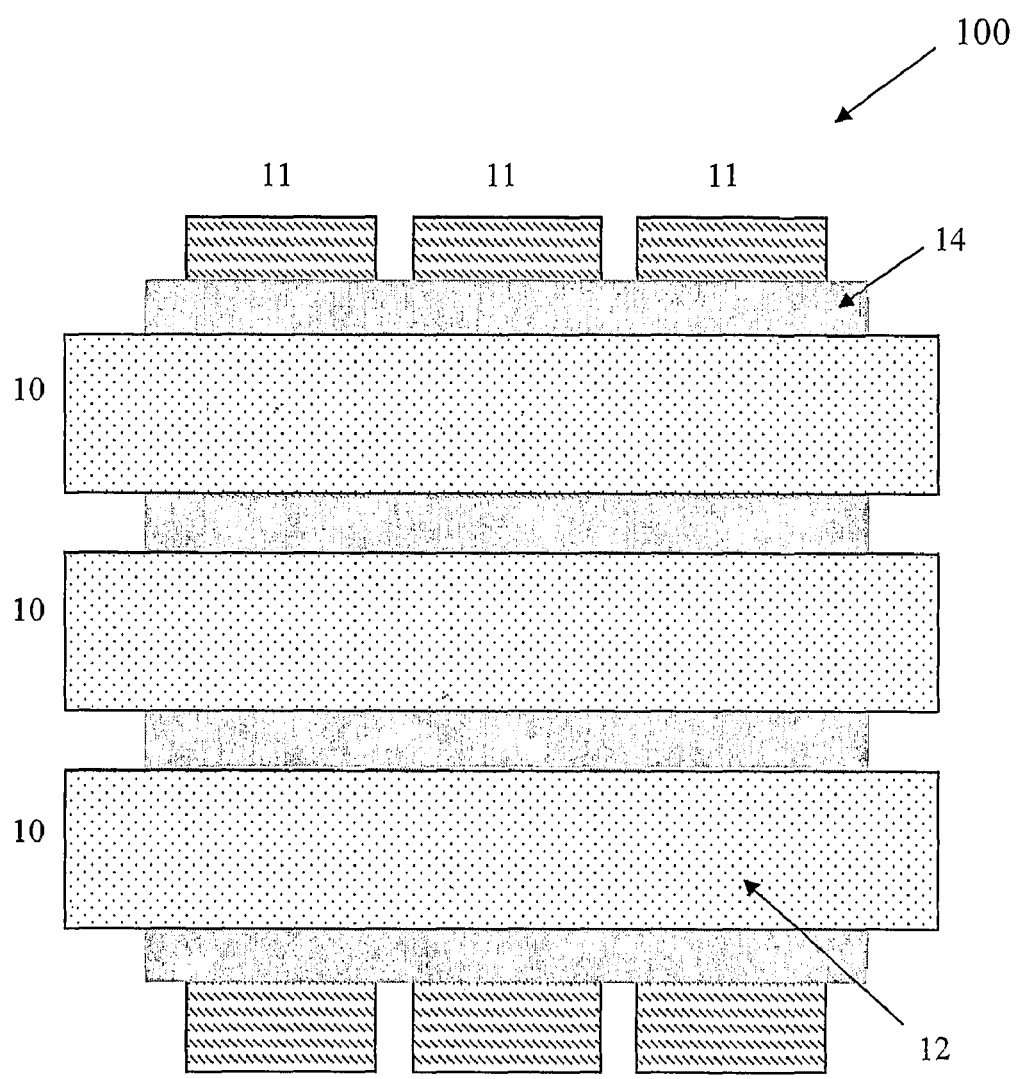

FIG. 5 exemplifies one possible way to implement an array of such memory cells. Device 100 includes cathode strips 10 arranged as rows in a first plane, anode strips 11 arranged as columns in a second spaced-apart parallel plane, "central" floating gates 12 aligned with overlapping regions between the cathodes and anodes, and shielding electrodes 14 formed by patterning a shielding electrode layer located between the cathodes' and anodes' planes.

For another example, although not specifically shown, a single cathode electrode may be shared by a two-dimensional "block" of cells (rather than a "row"), without shielding between the cells. This type of configuration is simpler to manufacture and can increase overall efficiency. If the cathode is a photocathode, then such a configuration requires less light intensity. Because the potential difference between the anode of the specific cell that is read or written and the cathode electrode is higher than that of the cells which are not operated, a relatively large percentage of electrons which are emitted from the entire area of the photocathode will be focused toward this specific cell. This enables to use lower overall illumination intensity, and yet obtain the required currents to a particular cell for performing an operation.

Figure 6:
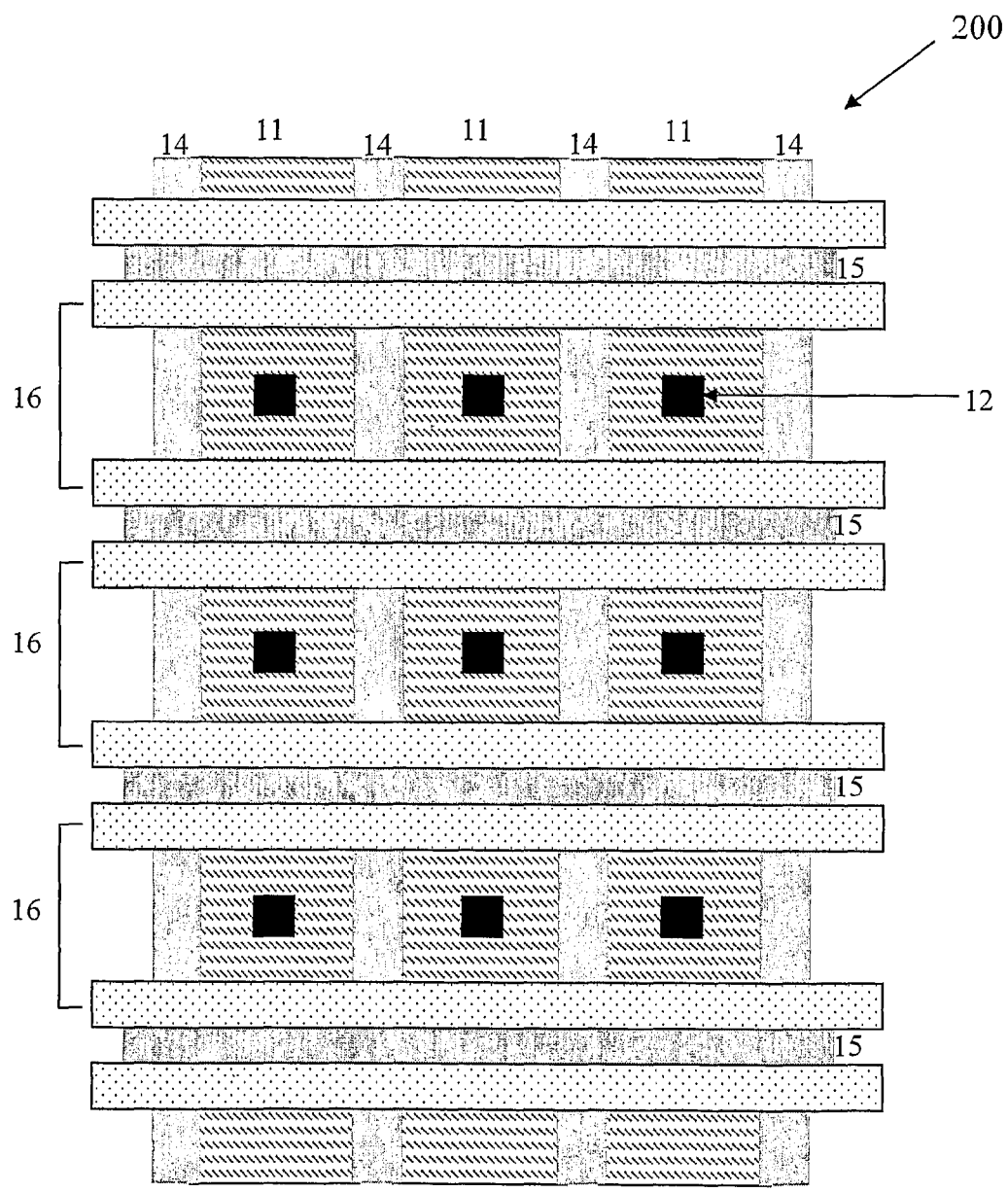
FIGS. 6 to 8 show three examples, respectively, of a multi-cell memory device utilizing a single common cathode.

Referring to FIG. 6, a device 200 of yet another configuration is shown. Device 200 utilizes a single cathode (not shown) for a plurality of cells, and is therefore simpler to manufacture than a device consisting of cathode strips, yet allows for the same kind of "row" and "column" access described previously. Anodes 11 are strips ("columns"), separated by shielding electrodes 14. Additional shielding electrode strips 15 are provided being located over shielding electrodes 14 and orthogonal thereto. Suitable insulation can be added at the intersections. Floating gates 12 lie in a plane slightly above that of anodes 11, and are aligned with square regions defined by the intersections of shielding electrodes 14 and 15. Also provided in the device are gate electrode strip pairs 16. Strips 15 provide shielding between these gate electrode strip pairs 16. The cathode is placed over the entire structure. Gate electrode pairs 16 are used to select and deselect a row. The rows are thus defined by gate strips 16 rather than by cathode strips.

Figure 7:
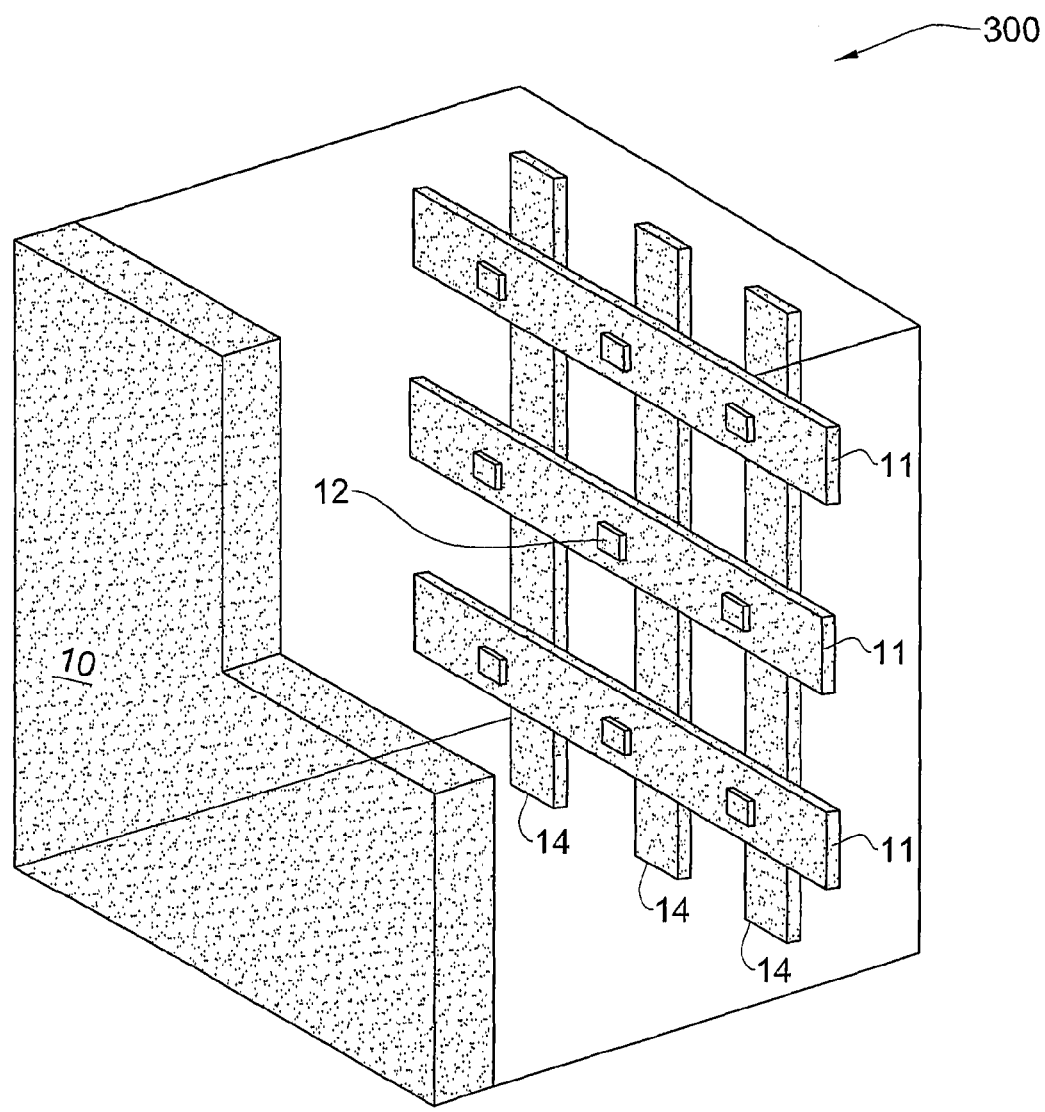

Yet another configuration is depicted in FIG. 7. Here, a device 300 also utilizes a single cathode 10 for a plurality of cells, and has the advantage of yet simpler production. Additional electrodes strips 14 are placed slightly "behind" (i.e., further away from cathode 10), and are orthogonal to anode strips 11. These electrodes 14 serve as control gates. Floating gates 12 are placed at the thus formed intersections between anodes 11 and electrodes 14. No shielding electrodes are shown here, but can be included, although this increases production complexity and size. In this configuration, the voltages applied to the electrodes defining deselected cells not only prevent emitted electrons from reaching the deselected cells, but also serve to deflect the electrons towards the selected cell. During the device operation, anodes 11 of the deselected cells, and in particular those on each side of the selected cell's anode, are set to suitable negative voltages (relative to the cathode). The same applies to control gates 14, although the voltage values may differ due to the difference in distance from floating gate 12 and shielding effects. This deflects electrons emitted from the cathode towards the selected cell of the cell matrix.

The configuration of FIG. 7 can be easily miniaturized. Floating gates 12 are the smallest essential feature of the device. Their actual size (area) is defined by the minimal feature size (in two dimensions) that can be manufactured using available technology. This defines also the minimal area of intersection between anode strips 11 and control gates 14, upon which floating gates 12 are located. The minimal width of each electrode strip (of anodes 11 and of control gates 14) is thus also equal to the minimal feature size, as is the spacing between adjacent electrodes, and between adjacent floating gates. The resultant size of each individual cell in the matrix is thus only $2F \times 2F = 4F^2$, where F is the minimal feature size.

Figure 8:
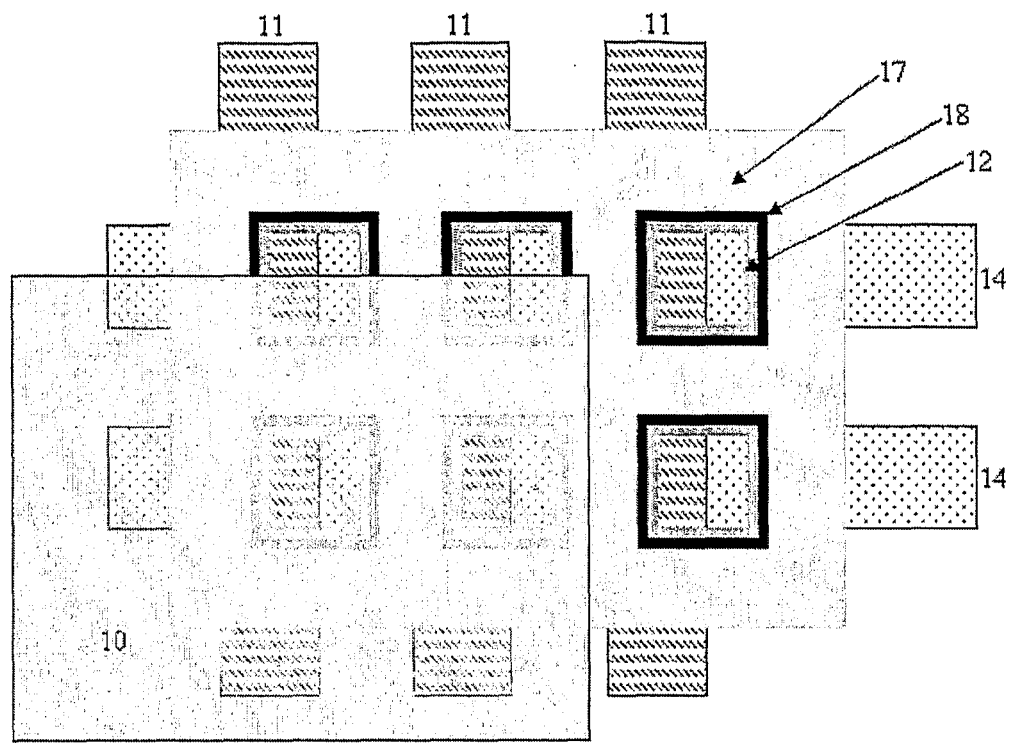

A modification of the device of FIG. 7 is shown in FIG. 8. Device 400 of FIG. 8 does not use floating gates at the intersections of the electrode strips. Instead, a metallic plate 17 is placed over electrode strips 11 and 14 (between these and cathode 10), that has holes at the intersections of the same size. The edges of each hole are coated with insulating material 18, over which a metallic layer constituting floating gate 12, associated with that hole, is deposited. Each floating gate 12, in this configuration, covers not the entire region of intersection of its corresponding anode 11 and control gate 14, but only the edges (periphery) of this region. Plate 17 is to be placed at an offset to the intersections themselves (i.e., not aligned) so that electrons reaching a hole from cathode 10 can reach relevant anode 11 and/or be affected by its potential, and also be affected by the potential of relevant control gate 14. It should be noted that in this configuration too, the size of an individual cell in the matrix is $2F \times 2F = 4F^2$, where F is the minimal feature size.

In another aspect, the present invention provides for the production of a floating gate by self-assembling molecules on an electrically conductive electrode that serves as an anode. In one embodiment of the invention, metal or semiconductor nanospheres are attached to the opposite free side of the molecules. In another embodiment, the molecules contain several metal atoms as part of their structure.

The technology for self-assembled monolayers is well established and controlled. It is possible to organize organic amphiphilic molecules in a close packed structure on a substrate by immersing the substrate in a solution containing these molecules. The molecules have a functional group that binds them to the substrate. It has also been demonstrated that it is possible to attach metal nanoparticles to a self-assembled monolayer and to thereby obtain a layer of nanoparticles organized at a fixed distance from the substrate and separated therefrom by organic molecules. For example, an article "Self-assembling of InAs nanocrystals on GaAs: The effect of electronic coupling and embedded gold nanoparticles on the photoluminescence", Y. Paltiel, A. Aharoni, U. Banin, 0. Neuman, R. Naaman, *Appl. Phys. Lett.* 89, 033108 (2006) studies the self-assembling of InAs nanocrystals, with and without codeposition with Au nanoparticles, on GaAs substrates using different organic molecules as linkers. Another publication "Assemblies of CdS quantum particles studied by the attenuated low energy photoelectron spectroscopy", A. Samakhvalov et al., *J. Phys. Chem. B* 104(36) (2000) reports on collective electronic properties observed in assembled CdS quantum particles arranged in periodic layers. Yet another publication "Electrical properties of short DNS oligomers characterized by conducting atomic force microscopy", Claude Negues et al., *Phys. Chem. Chem. Phys.* 6 4459 (2004) describes complementary single-strands of DNA, one bound to a gold electrode and the other to a gold nanoparticle, hybridized on the surface on the surface to form a self-assembled dsDNA bridge between the two gold contacts.

Upon exposing the self-assembled structure to free electrons, the nanospheres or the metal atoms become charged. The charging depends on the number of units charged and the charge accumulated on each unit, which in turn depends on the electron current, the electrons' energy, the surrounding fields, etc. Once charged, the floating gate serves as a barrier for low energy electrons, so that these do not penetrate through the gate and reach the anode. Discharging of the floating gate occurs by applying a positive potential on the gate, thereby reducing the barrier.

Thus, the present invention provides for a memory device operating with a self-assembled floating gate. The gate is preferably made from self assembled monolayer made from organic molecules to which nanoparticles are attached. The nanoparticles are made either from metal or semiconductor material. The organic molecules are self-assembled on the anode. The organic molecules may contain one or more metal atoms, for example InAs nanocrystals, with and without codeposition with Au nanoparticles. The discharging of the device is implemented by biasing the anode at a positive potential. The charging of the gate is carried out by free electrons.

Figure 9A:
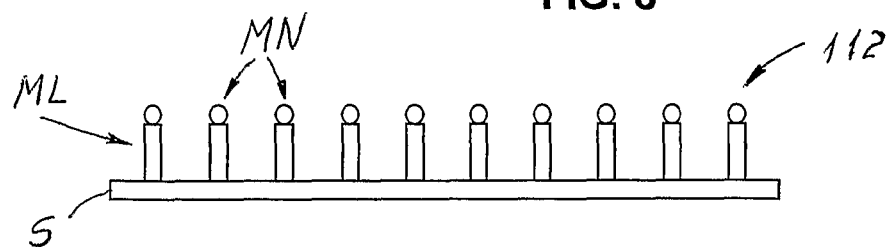
FIGS. 9A and 9B exemplify a floating gate of the present invention configured as a self-assembled structure.
Figure 9B:
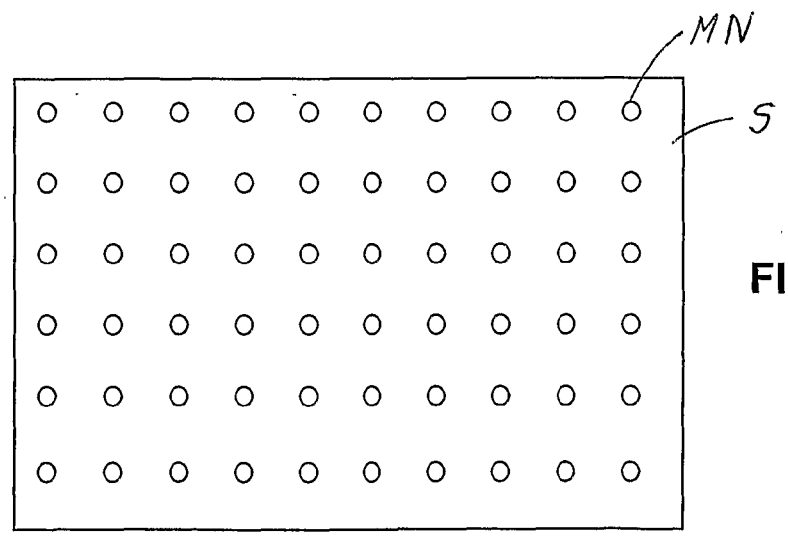

The memory device according to the above-described aspect of the present invention can provide the small in size and inexpensive to produce memory storage. This allows for an operational configuration in which the memory storage is separated from the reading/writing mechanism. FIGS. 9A and 9B show schematically side section and top view, respectively, of a floating gate 112 configured as a self-assembled structure. As shown, a self-assembled monolayer ML of organic molecules is formed on a substrate S, and metal nanoparticles MN are attached to monolayer ML.

This structure 112 is then used with a read/write mechanism formed by an electron source (such as a photocathode) and an electrons director assembly configured for directing the emitted electrons to a particular area of the monolayer. Such an electrons director assembly may include plates, as in CRT, or a grid screen.

The present invention also provides storing multiple bits of information in a single device (memory cell). This is illustrated in FIG. 10.

Figure 10:
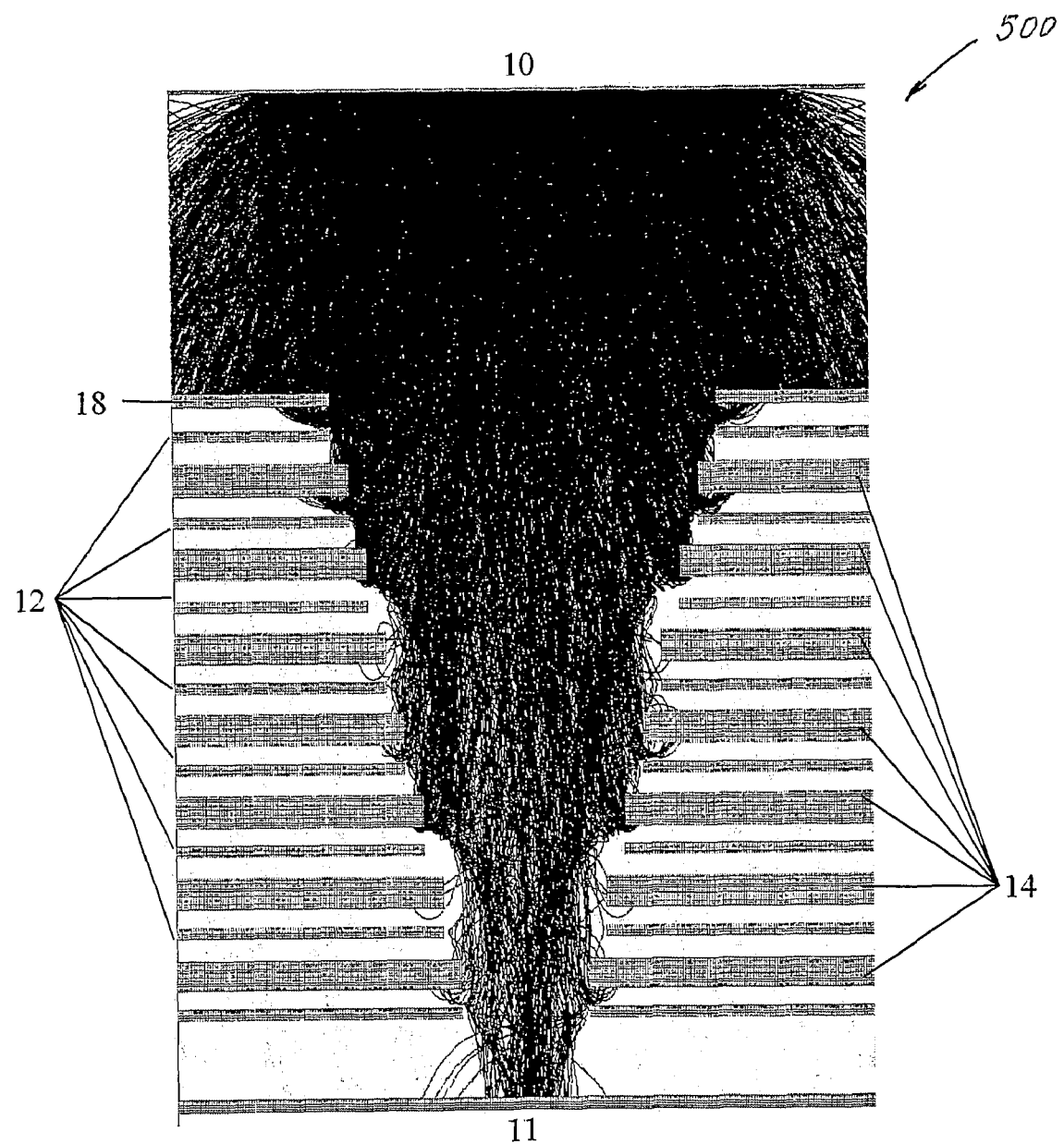
FIG. 10 exemplifies a memory cell of the present invention configured for storing multiple bits of information.

FIG. 10 depicts a non-limiting, demonstrative embodiment of a basic device unit or memory cell 500 of the present invention capable of storing multiple bits of information (seven bits in the present example). The figure presents a side-sectional view of a device including a photocathode 10 (associated with a suitable illumination source to cause electron emission), a main anode 11, a gate electrode 18, an array of floating gate electrodes 12 (the number of which corresponds to the number of information bits stored in the device), interlaced with a corresponding array of anode electrodes 14. In the present example, seven floating gates 12 and seven anodes 14 are used. Additional electrodes may be used as well, for example electrode (not shown) extending perpendicular to the plane of the page (functionally similar to electrodes 15 in FIG. 5). The device is associated with a control system (not shown) including a voltage supply unit operated to controllably vary the voltage supply to the non-floating electrodes 10, 11, 18, and 14. Each of anodes 14 is associated also with an output contact (not shown) in which an electric current is induced by the arrival of electrons to the respective anode. When one of floating gates 12 is sufficiently negatively charged, electrons do not reach the respective anode 14 adjacent to that floating gate. The outputs may all be "read" simultaneously. Gate 18 shields the floating gate of the array 12 closest to cathode 10 from direct bombardment by emitted electrons, and can be used also to deactivate the device. This is done by applying voltage to gate 18 that is sufficiently negative relative to cathode 10 to prevent electrons from escaping and traversing the device. It is useful when requiring selective access in a plurality of such devices.

In FIG. 10, electron flow is shown for the case where the third and sixth floating gates of the array 12 (counting from cathode 10 and not including gate 18) are charged to a sufficiently negative potential to prevent electrons from reaching the third and sixth anodes of array 14 (similarly counting). No electric current is thus generated at these outputs. The main anode 11 is for example at 1Volt relative to cathode 10. Emitted electrons flow from cathode 10 to anode 11, with dispersion sufficient to generate current at each of anodes 14 whose adjacent floating gates 12 are not sufficiently negative.

It is furthermore possible for each floating gate and anode pair in a device such as that of FIG. 10 to be associated with more than a single bit of information. The output current of each anode depends on the charge accumulated on its respective floating gate. The resolution with which a floating gate's charge can be determined from the measured output current defines the number of distinguishable states of the floating gate, and hence the number of bits it represents. Four states, for example, correspond to two bits.

Thus, the non-volatile memory deice of the present invention is capable of holding a comparatively large number of bits per cell. In the example of FIG. 10 seven bits are shown, and this number can be increased. Moreover, each of these seven gates can hold more than one bit. Generally, the device may hold more than four bits of information.

It should be noted that if the floating gates in such a device are discharged using photoemission, then the dimensions of the opening should be sufficiently large to allow suitable light intensity to reach the floating gates.

Figure 11A:
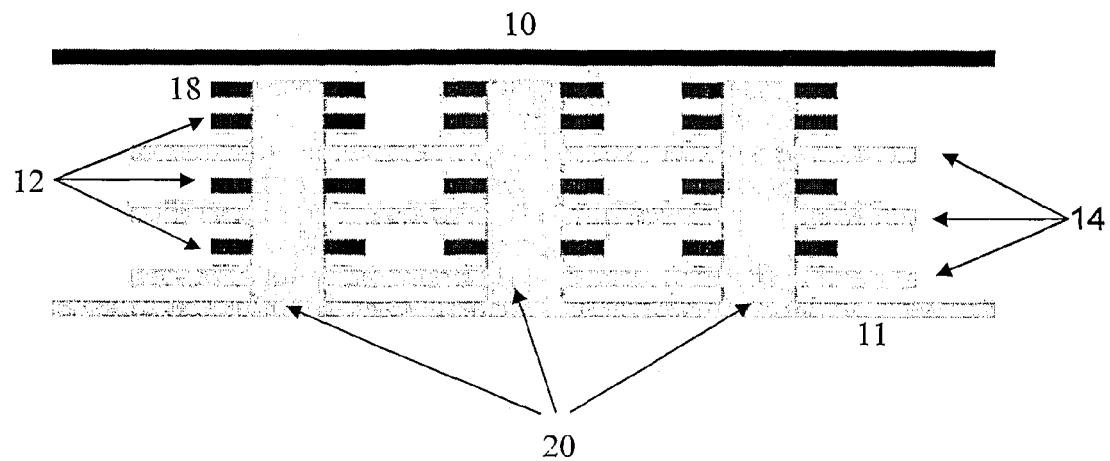
FIGS. 11A and 11B exemplify a memory device of the present invention formed by a plurality of multiple-bit memory cells.
Figure 11B:
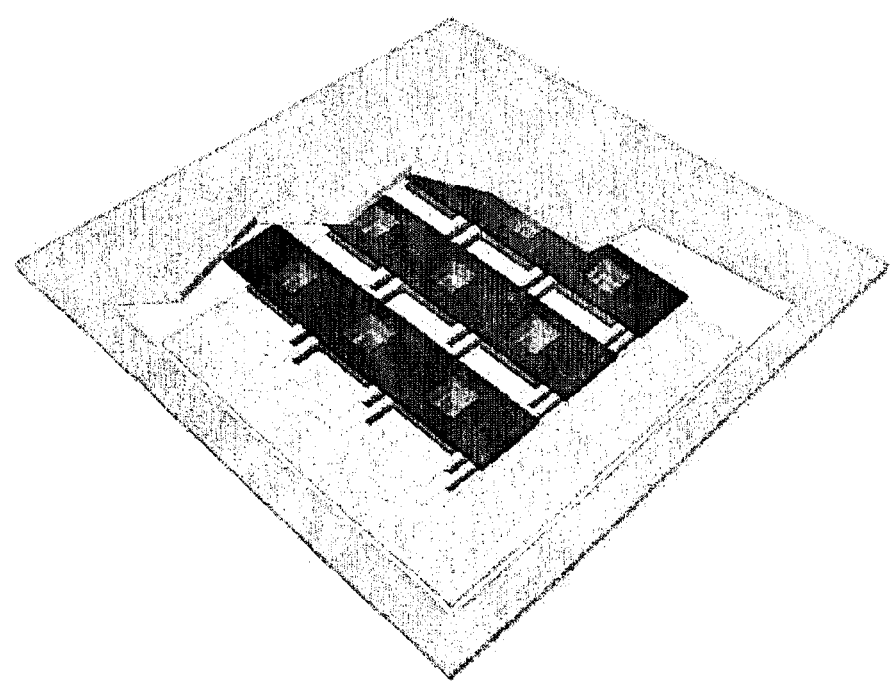

Reference is made to FIGS. 11A and 11B showing a cross section and perspective view, respectively, of a memory device consisting of a plurality of multiple-bit memory cells according to the present invention manufactured and used together in a large-scale memory matrix. Considering, for example, a device formed by memory cells of FIG. 10, a large main anode 11 common to all the cells constitutes a base and a plane of reference. Anodes 14 are electrode strips extending in one planar direction and stacked one above the other. Over these, and oriented orthogonally to them, are control gate 18 electrode strips. In between the stacked anodes, and located in the areas defined by the intersections of the anode stacks and control gates, are floating gates 12. Through each stack of anodes and floating gates, at each intersection, a hole 20 is etched revealing the main anode 11. A single common photocathode 10 is located over the entire structure. Construction of the layers and etching of the hole can be done such that the cross section is conical. All the devices in a "row" of the matrix share common control gate 18. Anodes 14 are common to all the cells in a "column". In order to select a particular device, control gates 18 of all the other "rows" are set to a deactivating potential, and the anodes of all the other "columns" can be set to a deactivating potential as well.

Figure 12A:
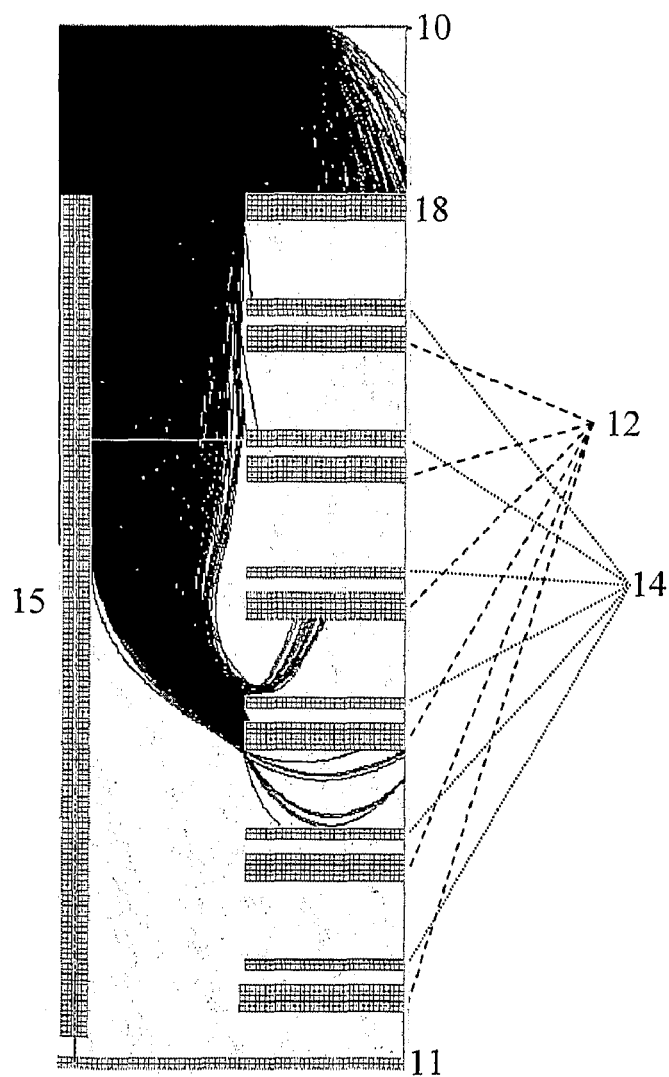
FIGS. 12A to 12C illustrate the data write and read procedures carried out in a memory device of the present invention formed by a plurality of multiple-bit memory cells.
Figure 12B:
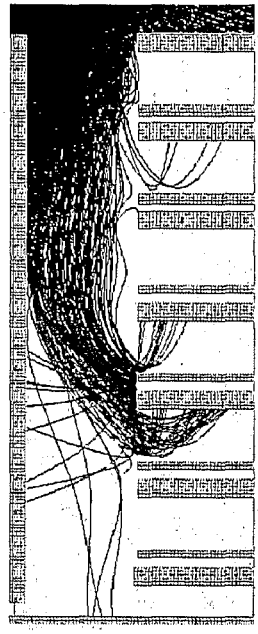
Figure 12C:
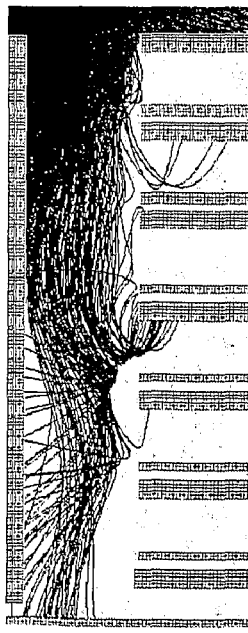

Reference is made to FIGS. 12A-12C illustrating the write and read procedures carried out in a device of a slightly different configuration, including a (photo-) cathode 10, a main anode 11, a control gate 18, an array of floating gates 12 interlaced with an array of anodes 14, and an additional electrode 15. FIG. 12A shows a program, or "write", operation. The depicted cross-section is of a planar device configuration, with electrodes extending into the plane of the page. The device, similar to that of FIG. 10, is associated with an illumination source (not shown) for illuminating cathode 10, and a control unit (not shown) for adjusting the voltages of the non-floating electrodes 10, 11, 18 and 15. The voltages applied in this example are such that electrons emitted from cathode 10 reach the fourth floating gate of array 12 (counting from cathode 10 and not including control gate 18), and charge it. Additional electrode 15 serves to deflect electrons towards arrays 12 and 14 of floating gates and anodes, by adjusting electrode 15 to a small negative potential relative to that of arrays 12 and 14. FIGS. 12B and 12C show a "read" operation of the fourth anode. FIG. 12B corresponds to a situation in which the adjacent floating gate is not charged (and therefore maximum current reaches the anode), and FIG. 12C corresponds to a situation in which the floating gate is charged (and therefore minimum current reaches the anode).

Figure 13:
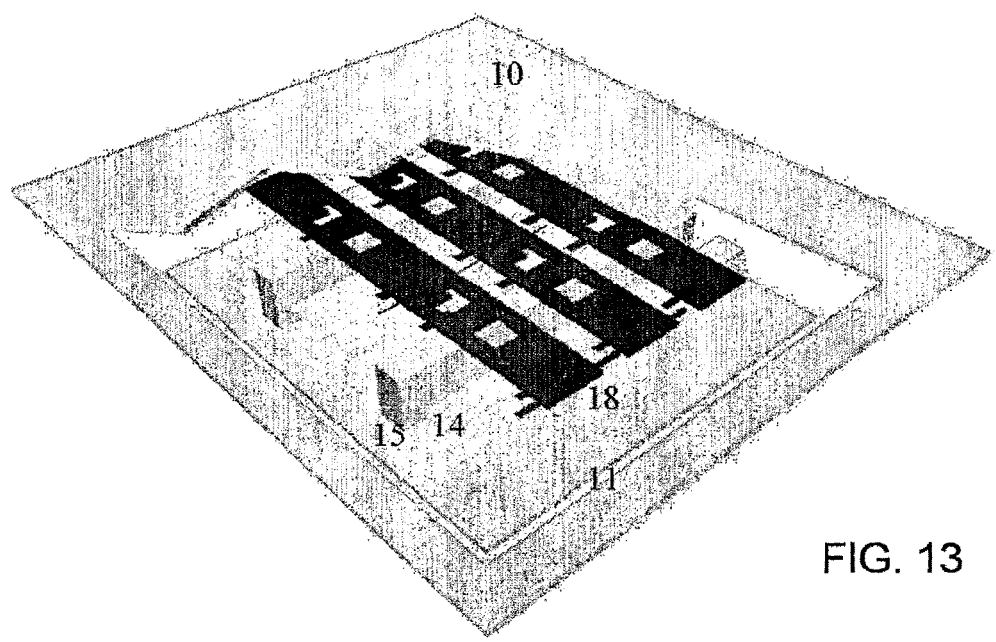
FIG. 13 illustrate more specifically the configuration of the device whose operation in demonstrated in FIGS. 12A-12C.

As shown in FIG. 13, in a memory matrix of such devices, electrode 15 is common to two adjacent devices (memory cells); a block unit is formed by two devices, mirrored about the common electrode 15. Electrode 15 extends into the plane of the page as do anodes 14, and is therefore common also to all devices in a "column" of the matrix. Control gates 18 of all devices in a "row" are interconnected.

Figure 14A:
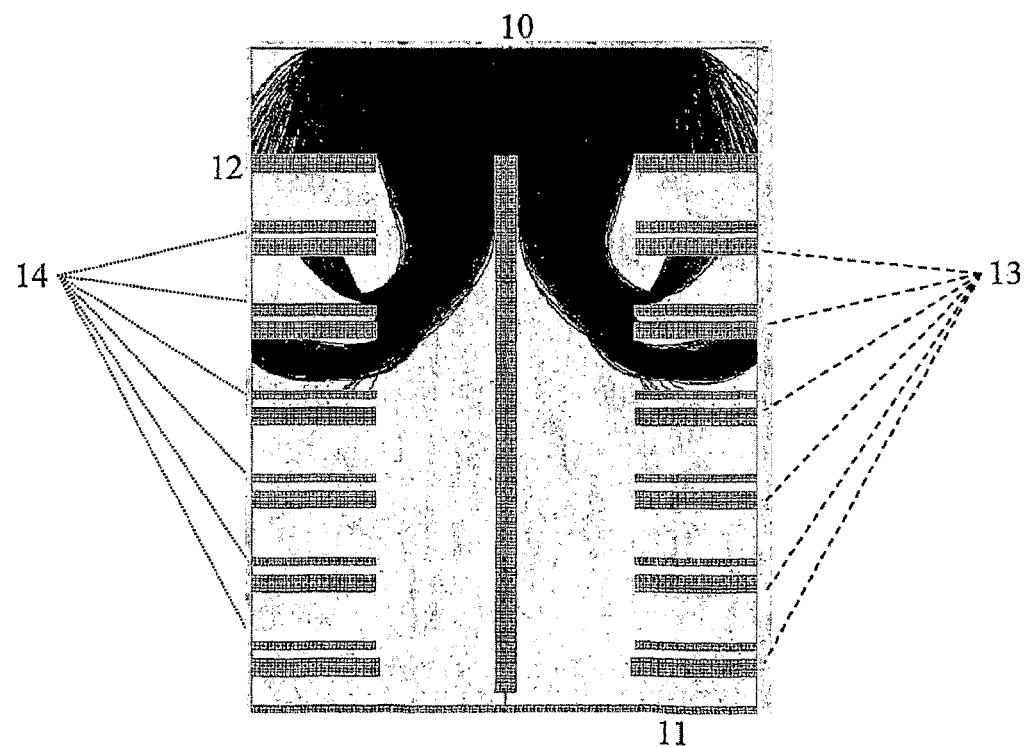
FIGS. 14A and 14B show a program (write) operation of the floating gate in a memory device of other examples of the invention showing how an insulator of the device operationally demonstrated in FIGS. 12A-12C can be replaced by additional conducting layers.
Figure 14B:
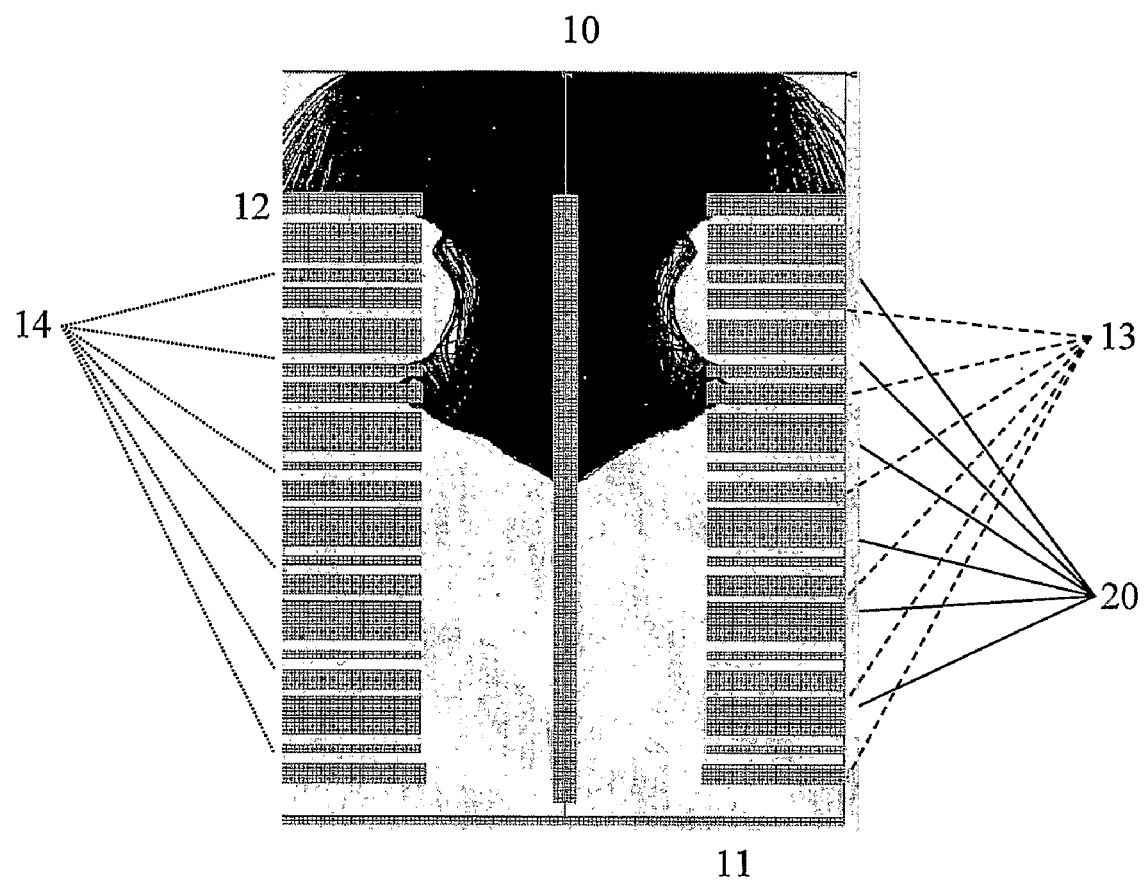

It is possible to use a device similar to that of FIGS. 12A, 12B, and 12C, but where most of the insulator is replaced by additional conducting layers. These serve two purposes: collecting most of the charges that otherwise would accumulate in and charge the insulator, and allowing for greater focusing of the emitted electrons' trajectories. FIGS. 14A and 14B show a program (write) operation of the second floating gate in a device without and with such additional electrodes 20, respectively.

Further embodiments according to the present invention may utilize additional electrodes (such as electromagnetic lenses); may use different number of gates-anode pairs, in a conical or perpendicular aperture shape, in spherical or rectangular symmetry for each cell, etc, and may even use charge carriers other than electrons, with similar resultant behavior. Furthermore, in general, write/read operations can be performed to a single gate or to several at once, by fine tuning the voltages of the anodes, where the latter option benefits from higher operation speed but may be more complex to design.

The invention claimed is:

1. An electronic memory device comprising at least one basic unit, which is configured as a memory cell for storing at least one bit of information, the basic unit comprising a vacuum cavity for free charge carriers propagation therethrough, and comprising a source of charge carriers defining a region of charge carriers emission or entry into the vacuum cavity and an anode electrode which are kept under controllable voltage conditions, and at least one floating gate electrode accommodated in a path of said free charge carriers propagating through the vacuum cavity between said emission or entry region and said anode, the source of charge carriers comprising a photocathode under controlled illumination to cause emission of electrons therefrom, said at least one floating gate electrode serving for storing therein a charge indicative of the at least one bit of information.

2. The device of claim 1, comprising a control system, comprising a controllably operated voltage supply unit to controllably vary said voltage conditions.

3. The device of claim 2, wherein said control unit is configured and operable to be responsive to data indicative of an electrical output from said anode electrode.

4. The device of claim 2, wherein the control system is configured and operable to selectively cause programming of said at least one memory cell, reading the information stored in the memory cell and erasing the stored information.

5. The device of claim 4, wherein the control system is configured and operable to cause said programming by providing the predetermined voltage conditions corresponding to a programming potential difference $V_{prog}$ that causes the charge carriers propagating through the vacuum cavity to reach the floating gate electrode and accumulate therein, thereby charging the floating gate electrode until a predetermined potential is reached that no longer allows electrons to reach floating gate, and retaining this charge at the floating gate.

6. The device of claim 5, wherein the memory cell is configured for storing the single bit of information, the charged and discharged states of the floating gate corresponding to Boolean values '1' and '0'.

7. The device of claim 5, wherein the memory cell is configured for storing the multiple bits of information corresponding to distinct ranges of the electrical output at the anode.

8. The device of claim 2, configured to cause erasing of the previously stored information by an effect of tunneling of the charge carriers from the floating gate electrode to the anode, the control system operating to provide a substantially high electric field in the vacuum cavity to induce tunneling of the charge carriers from the floating gate electrode while preventing the charge carriers tunneling to the floating gate electrode.

9. The device of claim 1, wherein an electrical output from said anode electrode is connected to an additional electronic device.

10. The device of claim 9, wherein said additional electronic device is configured as the memory cell.

11. The device of claim 1, wherein said voltage conditions determine an electric field created in the vacuum cavity, thereby defining whether or not, and how many, charge carriers reach the anode, resulting in the electric output at the anode.

12. The device of claim 11, wherein the electric field is determined as one of the following: (a) potential differences between the cathode, the floating gate, and the anode; and (b) the charge on the floating gate, and the voltage on the anode.

13. The device of claim 1, wherein the floating gate electrode has at least one of the following configurations: (i) the floating gate electrode has a ring-like shape defining an aperture in the electrons path towards a central part of the anode; (ii) the floating gate electrode is aligned with a central part of the anode; (iii) the floating gate electrode is configured as a grid accommodated adjacent to the anode or to said emission or entry region, to thereby enable obtaining a stronger field within the region of the floating gate location.

14. The device of claim 1, wherein the floating gate electrode is aligned with a central part of the anode, the control system being configured and operable to carry out the following: cause said reading by providing the predetermined voltage conditions corresponding to a reading potential difference $V_{read}$ resulting in an anode current $I_a$, while substantially not affecting the floating gate potential; and receiving data indicative of the anode current.

15. The device of claim 1, wherein the floating gate electrode is aligned with a central part of the anode, the control system being configured and operable to cause erasing of the stored information by creating the predetermined voltage conditions corresponding to an erasing potential difference $V_{eraze}$ resulting in discharging the floating gate, so that it returns to zero potential.

16. The device of claim 1, wherein the charge storable on the floating gate electrode depends on a potential difference between said source and the anode, maximal kinetic energy of the emitted charge carriers, and inter-electrode capacitances.

17. The device of claim 1, configured to cause erasing of the previously stored information by an effect of tunneling of the charge carriers from the floating gate electrode.

18. The device of claim 17, comprising an additional electrode placed adjacent to the floating gate electrode and electrically insulated therefrom, such that an effect of charge carriers tunneling from the floating gate electrode to said additional electrode is substantially slight under programming and reading the memory cell and is substantially high when a relatively large voltage is applied to said additional electrode, thereby facilitating erasing of the previous stored information.

19. The device of claim 1, comprising a switch unit configured for closing during erasing of the previously stored information, thereby discharging the floating gate electrode.

20. The device of claim 19, wherein the switch unit comprises an additional source of the charge carriers associated with an additional anode electrode, said additional source of the charge carriers being electrically connected to the floating gate electrode, such that during programming the memory cell and reading the information stored therein no charge carriers are injected from said additional source to its associated additional anode, but the charge carriers are injected when erasing the previously stored information.

21. The device of claim 20, wherein said additional source comprises an illuminated photocathode, which is permanently kept at a potential of said floating gate.

22. The device of claim 1, configured for discharging the floating gate by at least one of photo-emission, field-emission, and thermo-emission effects.

23. The device of claim 22, configured for exposing the floating gate electrode to an external field.

24. The device of claim 23, wherein the cathode and the floating gate are made of photoemissive materials with distinct effective work functions.

25. The device of claim 24, wherein the cathode has a relatively lower work function as compared to that of the floating gate electrode.

26. The device of claim 24, configured for exposing the cathode and the floating gate electrode to the same illumination source producing light that is energetic enough for electrons to be emitted from the photocathode, but not energetic enough for electrons to be released from the floating gate electrode, the cathode being thus made active without discharging the floating gate, the previously stored information being erasable by discharging the floating gate by at least one of the following: exposing the floating gate to light that is more energetic and applying predetermined potentials to the cathode and the anode such as to cause field assisted photoemission at the floating gate.

27. The device of claim 1, comprising a matrix of the memory cells arranged in a manner allowing addressing the individual memory cell for programming, reading and erasing operations.

28. The device of claim 27, wherein the anodes of all the memory cells are arranged in a spaced-apart relationship along a first axis and connected to a first common line, and the cathodes of all the memory cells are arranged in a spaced-apart relationship along a second substantially perpendicular axis and connected to a second common line, thereby enabling selectively addressing one of the memory cells by providing the predetermined voltage conditions in the vacuum cavity of said memory cell different from the voltage conditions in the other memory cells.

29. The device of claim 28, wherein the floating gate electrode of each of the memory cells is aligned with a central part of the respective anode.

30. The device of claim 28, comprising shielding electrodes around each of the memory cells, thereby reducing electrostatic cross talk between the memory cells.

31. The device of claim 30, wherein the shielding electrodes are kept at ground potential.

32. The device of claim 31, wherein the matrix of the memory cells is formed by cathode strips arranged in the spaced-apart relationship along the first axis in a first plane, anode strips arranged in the second spaced-apart parallel plane, the floating gate electrodes aligned with overlapping regions between the cathodes and the anodes, and shielding electrodes formed by a patterned shielding electrode layer located between the first and second planes.

33. The device of claim 30, wherein the shielding electrodes are electrically connected to said cathodes.

34. The device of claim 27, wherein the matrix of the memory cells is formed by the single cathode electrode shared by a two-dimensional array of the memory cells.

35. The device of claim 34, wherein said two dimensional array of the memory cells associated with the single cathode comprises:
the anode strips arranged in a spaced-apart relationship in a plane spaced-apart and parallel to the cathode plane,
first array of shielding electrodes accommodated in a space between the cathode and the anodes' planes and extending parallel to the anodes strips,
second array of shielding electrodes located over said first shielding electrodes orthogonal thereto,
the floating gates that are located in a plane above the anodes' plane close thereto and are aligned with regions defined by intersections of the first and second shielding electrodes,
gate electrode strip pairs accommodated such that shielding between them is provided by the second shielding strips, said gate electrode strips serving to select and deselect the anodes' line.

36. The device of claim 34, wherein said two dimensional array of the memory cells associated with the single cathode comprises:
the anode strips arranged in a spaced-apart relationship in a plane spaced-apart and parallel to the cathode plane,
an array of control gate electrodes accommodated in a space between the cathode and the anodes' planes and extending orthogonal to the anodes strips, and the floating gates that are located in a plane above the anodes' plane close thereto and are aligned with regions defined by intersections of the anode and control gate electrodes.

37. The device of claim 36, wherein the floating gates are of the smallest feature size F, thereby defining a minimal area of intersection between the anode strips and the control gates, upon which the floating gates are located, the size of each individual memory cell in the matrix thus being $2F \times 2F = 4F^2$.

38. The device of claim 34, wherein said two dimensional array of the memory cells associated with the single cathode comprises:
the anode strips arranged in a spaced-apart relationship in a plane spaced-apart and parallel to the cathode plane,
an array of control gate electrodes accommodated in a space between the cathode and the anodes' planes and extending orthogonal to the anodes strips, and
an electrically conductive plate placed over the anode and control gate strips being between these strips and the cathode plane, said plate being perforated at the intersections of the anode and control gate strips, with edges of each perforation being coated with an electrically insulating material,
the floating gates formed by an electrically conductive layer deposited on said electrically insulating coating, such that each of the floating gates covers the edges of a region of intersection of the corresponding anode and control gate.

39. The device of claim 38, wherein said electrically conductive plate is placed at an offset to the intersections thereby allowing the charge carriers that reach the perforation from the cathode to undergo at least one of the following: reach the respective anode and be affected by a potential of the respective anode, and also to be affected by a potential of the respective control gate.

40. The device of claim 39, wherein a size of an individual cell in the matrix is $2F \times 2F = 4F^2$, where F is the minimal feature size.

41. The device of claim 1, wherein the floating gate is a self-assembled structure formed by a monolayer to which electrically conductive nanoparticles are attached.

42. The device of claim 41, wherein said monolayer is formed by organic molecules self-assembled on a substrate.

43. The device of claim 42, wherein said substrate is the anode of the memory cell, allowing discharging of the memory cell by biasing the anode at a positive potential and charging the floating gate by free electrons.

44. The device of claim 43, comprising an electrons director assembly associated with the emission region of the photocathode and configured for directing the emitted electrons to a particular area of the monolayer.

45. The device of claim 44, wherein the electrons director assembly includes plates or a grid screen.

46. The device of claim 1, wherein the memory cell is configured for storing the multiple bits of information corresponding to distinct ranges of the electrical output at the anode.

47. The device of claim 46, comprising a gate electrode, an array of the floating gate electrodes of a number corresponding to the number of information bits storable in the memory cell, a corresponding array of additional anode electrodes interlaced with said floating gates, each of said additional anodes having an output contact in which an electric current is induced by arrival of the charge carriers to the respective anode, said gate electrode shielding the floating gate closest to the cathode from direct bombardment by the charge carriers.

48. The device of claim 47, formed by a plurality of said memory cells, the device comprising:
a structure formed by
the main anode common to all the cells,
an array of anodes strips extending in one planar direction and stacked one above the other,
an array of interconnected control gates accommodated over the anode strips and oriented orthogonal thereto,
an array of the floating gates located in between the stacked anodes in regions defined by intersections of the anode stacks and the control gates,
the anode stacks and the floating gates being perforated within the intersections between them revealing the main anode; and
the common photocathode located over said structure.

49. The device of claim 48, comprising an array of additional electrode strips arranged such that each additional electrode is common to two adjacent memory cells, said two memory cells thereby forming a block unit mirrored about the common additional electrode, the additional electrodes extends parallel to the anodes and being therefore common also to all the memory cells arranged along the axis of the additional electrode strips.

50. A method for producing an electrode unit for use in a memory device of claim 1, the method comprising:
providing a self-assembled monolayer of organic amphiphilic molecules on an electrically conductive substrate to serve as the anode of the memory cell;
attaching metal nanoparticles to said self-assembled monolayer thereby obtaining a layer of nanoparticles organized at a fixed distance from the substrate and separated therefrom by the organic molecules, said nanoparticles on the monolayer serving as the floating gate of the memory cell.

* * * * *